(12) United States Patent
Yeon et al.

(10) Patent No.: US 10,636,760 B2
(45) Date of Patent: Apr. 28, 2020

(54) SEMICONDUCTOR PACKAGES

(71) Applicant: Samsung Electronics Co., Ltd., Suwon-si, Gyeonggi-do (KR)

(72) Inventors: Seunghoon Yeon, Suwon-si (KR); Hyoeun Kim, Cheonan-si (KR); Jongbo Shim, Asan-si (KR); Yonghoe Cho, Bucheon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/044,696

(22) Filed: Jul. 25, 2018

(65) Prior Publication Data

US 2019/0214359 A1  Jul. 11, 2019

(30) Foreign Application Priority Data

Jan. 11, 2018 (KR) .................. 10-2018-0003769

(51) Int. Cl.

| | |
|---|---|
| *H01L 23/52* | (2006.01) |
| *H01L 23/00* | (2006.01) |
| *H01L 23/528* | (2006.01) |
| *H01L 23/538* | (2006.01) |
| *H01L 21/56* | (2006.01) |

(Continued)

(52) U.S. Cl.
CPC ............ *H01L 24/17* (2013.01); *H01L 21/563* (2013.01); *H01L 21/565* (2013.01); *H01L 21/568* (2013.01); *H01L 23/3128* (2013.01); *H01L 23/3171* (2013.01); *H01L 23/528* (2013.01); *H01L 23/5386* (2013.01); *H01L 24/14* (2013.01); *H01L 25/105* (2013.01); *H01L 24/13* (2013.01); *H01L 24/16* (2013.01); *H01L 24/29* (2013.01); *H01L 24/32* (2013.01); *H01L 24/73* (2013.01); *H01L 24/81* (2013.01); *H01L 24/92* (2013.01); *H01L 2224/13101* (2013.01); *H01L 2224/1403* (2013.01); *H01L 2224/14517* (2013.01); *H01L 2224/16225* (2013.01); *H01L 2224/17134* (2013.01); *H01L 2224/2919* (2013.01); *H01L 2224/32225* (2013.01); *H01L 2224/73204* (2013.01); *H01L 2224/81801* (2013.01); *H01L 2224/92125* (2013.01);

(Continued)

(58) Field of Classification Search
CPC ... H01L 21/563; H01L 21/568; H01L 21/565; H01L 23/3128; H01L 23/5386; H01L 23/3171; H01L 23/528; H01L 24/14; H01L 24/17; H01L 25/105
USPC ........................................................ 257/737
See application file for complete search history.

(56) References Cited

U.S. PATENT DOCUMENTS

| | | |
|---|---|---|
| 7,550,835 B2 | 6/2009 | Kang |
| 8,174,124 B2 | 5/2012 | Chiu et al. |

(Continued)

*Primary Examiner* — Luan C Thai
(74) *Attorney, Agent, or Firm* — Myers Bigel, P.A.

(57) ABSTRACT

A semiconductor package may include a base layer, and a redistribution layer on the base layer. The semiconductor package may include a first pattern, a second pattern, and a passivation layer covering the first and second patterns. The semiconductor package may include a semiconductor chip on the base layer, a first connection terminal between the base layer and the semiconductor chip and coupled to one of chip pads of the semiconductor chip, and a mold layer between the base layer and the semiconductor chip. The first connection terminal may extend into the passivation layer and may be coupled to the first pattern. The second pattern may be electrically insulated from the semiconductor chip.

19 Claims, 7 Drawing Sheets

(51) Int. Cl.
  *H01L 23/31*  (2006.01)
  *H01L 25/10*  (2006.01)
(52) U.S. Cl.
  CPC .............. *H01L 2924/15174* (2013.01); *H01L 2924/15311* (2013.01); *H01L 2924/181* (2013.01)

(56) References Cited

U.S. PATENT DOCUMENTS

| | | |
|---|---|---|
| 8,558,391 B2 | 10/2013 | Koide et al. |
| 8,581,400 B2 | 11/2013 | Liang et al. |
| 9,318,442 B1 * | 4/2016 | Chen ................... H01L 21/4857 |
| 9,406,588 B2 | 8/2016 | Lin et al. |
| 9,570,418 B2 | 2/2017 | Chen et al. |
| 9,613,914 B2 | 4/2017 | Chen et al. |
| 9,679,858 B2 | 6/2017 | Sekikawa |
| 9,691,686 B2 * | 6/2017 | Huang ................... H01L 21/565 |
| 9,716,066 B2 | 7/2017 | Lee et al. |
| 2012/0248621 A1 | 10/2012 | Sadaka |
| 2013/0082090 A1 | 4/2013 | Cho et al. |
| 2017/0229414 A1 | 8/2017 | Cheng et al. |
| 2018/0102313 A1 * | 4/2018 | Shih ................... H01L 21/4853 |

* cited by examiner

SEMICONDUCTOR PACKAGES

CROSS-REFERENCE TO RELATED APPLICATIONS

This U.S. nonprovisional application claims priority under 35 U.S.C § 119 to Korean Patent Application No. 10-2018-0003769, filed on Jan. 11, 2018, in the Korean Intellectual Property Office, the entire contents of which are herein incorporated by reference.

TECHNICAL FIELD

Aspects of the present disclosure relate to semiconductor packages.

BACKGROUND

Semiconductor packages are provided to implement integrated circuit chips for use in electronic products. Typically, a semiconductor package may be configured so that a semiconductor chip is mounted on a substrate, and bonding wires or bumps may be used to electrically connect the semiconductor chip to the substrate. With the advancing developments in the electronics industry, semiconductor packages are being developed in a variety of ways to reach various goals of compact size, small weight, and/or low (or lower) fabrication costs. In addition, many kinds of semiconductor packages are developed to accommodate the expansion of specific application fields, such as high-capacity mass storage devices.

Semiconductor chips having semiconductor devices may extend their internal circuit functions to external electronic devices through pads. Wire bonding has been mainly used to connect pads of semiconductor chips to external substrates. However, due to the increasing miniaturization of semiconductor devices and the increases in processing speeds and the number of internal input/output signals of semiconductor chips, more recently connection bumps on pads of semiconductor chips are being directly connected to substrates.

SUMMARY

Some embodiments of the present inventive concepts provide a semiconductor package with improved structural stability. The present disclosure is not limited thereto, however, and other objects which may not be expressly identified herein will be clearly understood to those skilled in the art from the following description.

According to some embodiments of the inventive concepts disclosed herein, a semiconductor package may include: a base layer; and a redistribution layer on the base layer. The redistribution layer may include a first pattern, a second pattern, and a passivation layer covering the first and second patterns. The semiconductor package may include a semiconductor chip on the base layer; and a first connection terminal between the base layer and the semiconductor chip. The first connection terminal may be coupled to one of the chip pads of the semiconductor chip; and a mold layer may be between the base layer and the semiconductor chip. The first connection terminal may extend into the passivation layer and may be coupled to the first pattern. The second pattern may be electrically insulated from the semiconductor chip.

According to some embodiments of the inventive concepts disclosed herein, a semiconductor package may include: a lower substrate comprising a lower base layer, a lower redistribution pattern and a first lower dummy pattern. The lower redistribution pattern and the first lower dummy pattern may be on the lower base layer, and a lower passivation layer may cover the lower redistribution pattern and the first lower dummy pattern. The semiconductor package may include an upper substrate comprising an upper base layer, an upper redistribution pattern and an upper dummy pattern. The upper redistribution pattern and the upper dummy pattern may be on the upper base layer, and an upper passivation layer may cover the upper redistribution pattern and the upper dummy pattern. The semiconductor package may include a first connection terminal that may be provided between and that may electrically connect the lower redistribution pattern and the upper redistribution pattern. The semiconductor package may include a mold layer between the lower substrate and the upper substrate. The first lower dummy pattern may be buried in the lower passivation layer. The upper dummy pattern may be buried in the upper passivation layer.

DETAILED DESCRIPTION OF THE EMBODIMENTS

Some embodiments of the present inventive concepts relating to semiconductor packages will now be described with reference to accompanying drawings.

Figure 1:
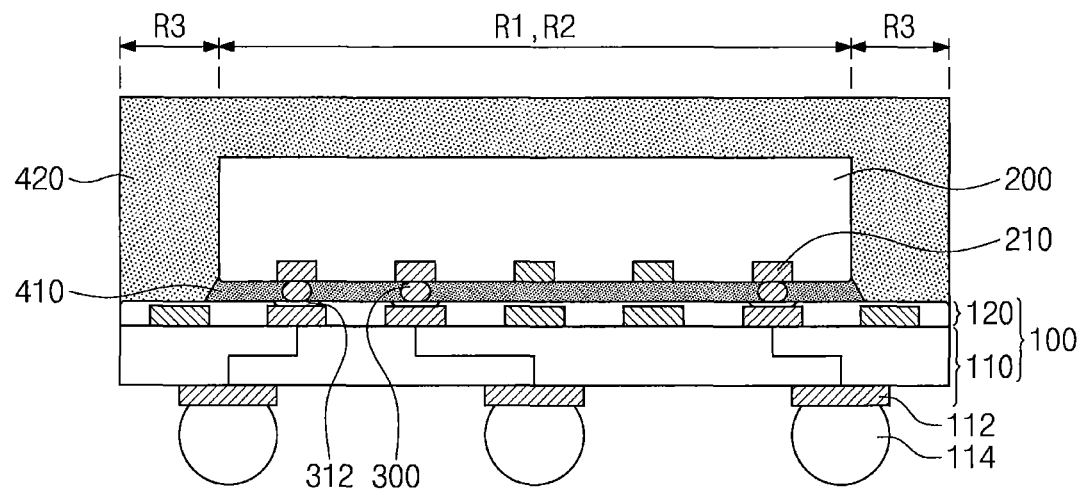
FIG. 1 is a cross-sectional view showing a semiconductor package according to some embodiments of the present inventive concepts.
Figure 2:
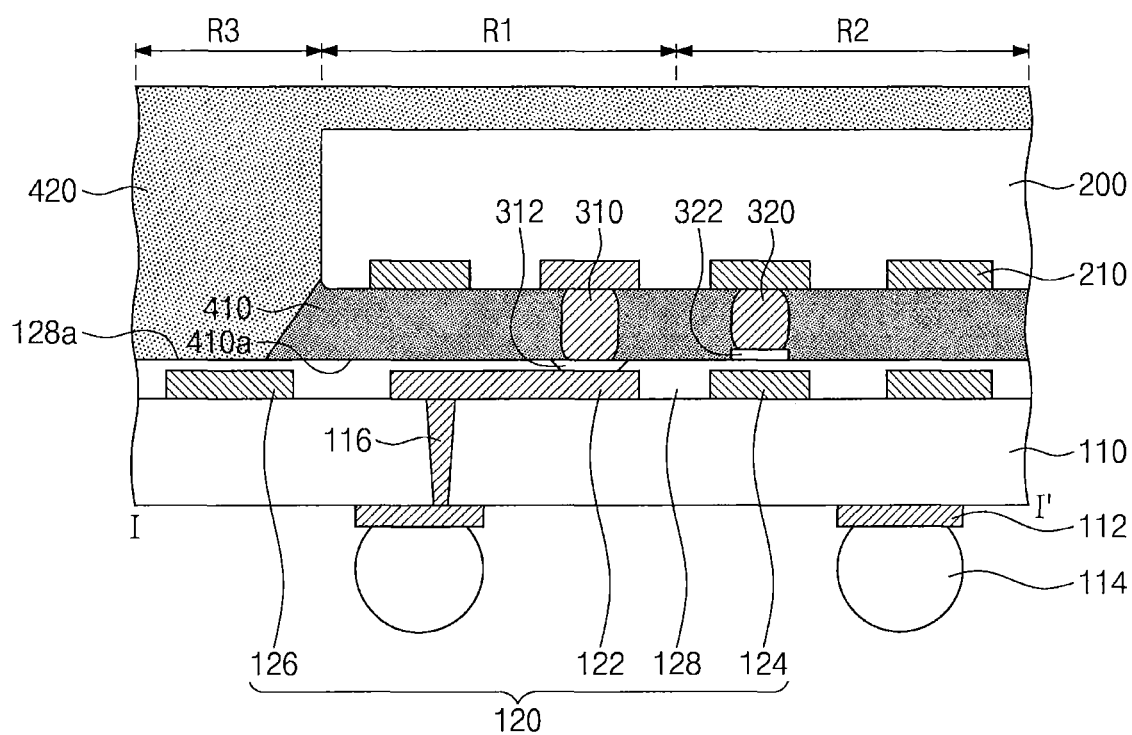
FIG. 2 is an enlarged view showing a portion of FIG. 1.
Figure 3:
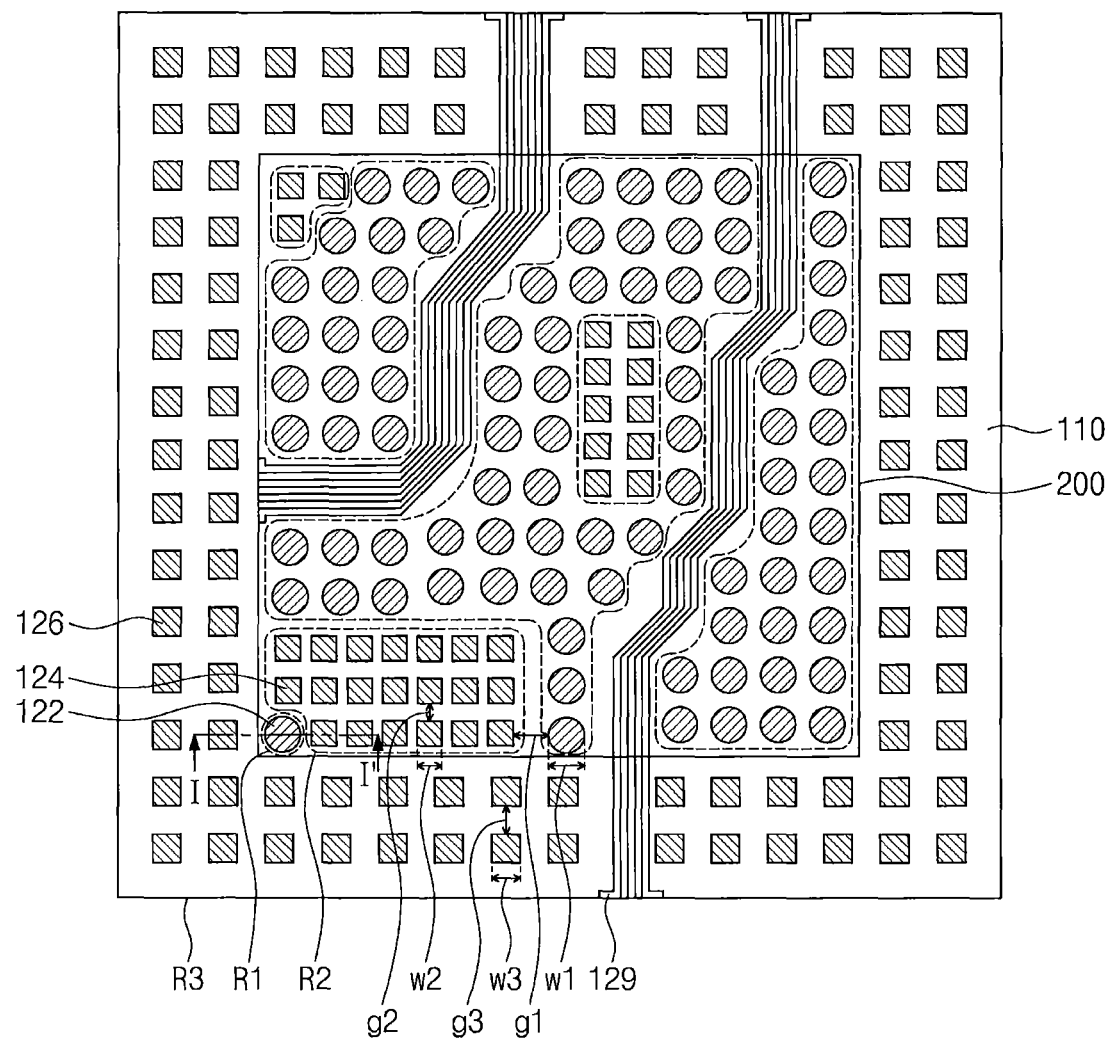
FIG. 3 is a plan view showing a lower redistribution layer.

FIG. 1 is a simplified cross-sectional view showing a semiconductor package according to exemplary embodiments of the present inventive concepts, some components of which semiconductor package are omitted for convenience of explanation. FIG. 2 is an enlarged view showing a portion of FIG. 1. FIG. 3 is a plan view of a lower redistribution layer, showing an example of arrangement of first redistribution patterns and second redistribution patterns. FIG. 2 corresponds to a cross-sectional view taken along line I-I' of FIG. 3.

Referring to FIGS. 1 to 3, a semiconductor package may include a substrate 100 and a semiconductor chip 200 mounted on the substrate 100. As examples, the following semiconductor devices may be mounted on the substrate 100 (e.g., the following semiconductor devices may be the semiconductor chip 200): a memory device such as DRAM or Flash memory; a logic device such as micro-controller; an analog device; a digital signal processor device; a system-on-chip device; or a combination of such devices. The present disclosure is not limited to these example semiconductor devices. Herein, an example in which one semiconductor chip 200 is mounted on the substrate 100 is discussed, but the inventive concepts are not limited thereto.

The substrate 100 may include a first region R1, a second region R2, and a third region R3 that are non-overlapping with one another when viewed in a plan view. The first and second regions R1 and R2 may overlap with the semiconductor chip 200, or may be an area where the semiconductor chip 200 is mounted. The substrate 100 may include a base layer 110 and a redistribution layer 120.

The base layer 110 may include an insulating substrate or a semiconductor substrate. For example, the insulating substrate may include silicon nitride (SiN), silicon oxide ($SiO_2$), or tetraethyl orthosilicate (TEOS). The semiconductor substrate may include silicon (Si). Alternatively, the base layer 110 may be a stacking structure of an insulating substrate and a semiconductor substrate. The base layer 110 may include external pads 112 on a bottom surface thereof. External connection terminals 114, such as solder bumps, may be provided on the external pads 112.

The redistribution layer 120 may be on the base layer 110. The redistribution layer 120 may include first redistribution patterns 122, second redistribution patterns 124, and a passivation layer 128 that are provided on a top surface of the base layer 110.

The first and second redistribution patterns 122 and 124 may be spaced apart from each other on the top surface of the base layer 110. For example, the first redistribution patterns 122 may be on or in the first region R1 of the substrate 100. The second redistribution patterns 124 may be on or in the second region R2 of the substrate 100. The second redistribution patterns 124 may be arranged in a grid fashion. The second redistribution patterns 124 may be evenly arranged on or in the second region R2 of the substrate 100. The second redistribution patterns 124 may be spaced apart from each other at equal intervals. The second redistribution pattern 124 may have a width w2 ranging from about 10 μm to about 50 μm. One or more of the first redistribution patterns 122 may neighbor one or more of the second redistribution patterns 124. One of the first redistribution patterns 122 and a neighboring one of the second redistribution patterns 124 may be spaced apart from each other at an interval g1, which may be about 1 to 2.5 times the width w2 of the second redistribution pattern 124. The second redistribution patterns 124 may be spaced apart from each other at an interval g2, which may be about 1 to 2.5 times the width w2 of the second redistribution pattern 124. The first redistribution patterns 122 may be electrically connected to the external pads 112 through internal lines 116 of the base layer 110. The second redistribution patterns 124 may be electrically insulated from the external pads 112 and the external connection terminals 114. For example, the second redistribution patterns 124 may be dummy patterns. Herein, the term "dummy pattern" may refer to a pattern that is electrically insulated and independent from an electrical circuit (e.g., conductive lines, patterns, or pads) at the same or adjacent levels. The first and second redistribution patterns 122 and 124 may each include a metallic material. In FIG. 3, the first redistribution patterns 122 are illustrated as circular shapes and the second redistribution patterns 124 are illustrated as rectangular shapes, but this difference is for easy discrimination in the present disclosure between the first and second patterns 122 and 124. The planar shapes of the first and second redistribution patterns 122 and 124 may not be limited to those mentioned above or those shown in the present disclosure. Although FIG. 2 shows one first redistribution pattern 122, FIG. 2 is an enlarged view showing a portion of the semiconductor package and a plurality of first redistribution patterns 122 may be provided in the semiconductor package.

The passivation layer 128 may cover the top surface of the base layer 110, the first redistribution patterns 122, and the second redistribution patterns 124. The passivation layer 128 may have a top surface 128a that is a substantially flat planation surface. The top surface 128a of the passivation layer 128 may be parallel to the top surface of the base layer 110. The passivation layer 128 may include holes (not designated by reference numerals) that expose the first redistribution patterns 122. The passivation layer 128 may include an ABF (Ajinomoto Build-up Film) or an insulating polymer such as an epoxy-based polymer. The passivation layer 128 may be a buffer layer that blocks foreign substances introduced into the first and second redistribution patterns 122 and 124.

The redistribution layer 120 may further include a conductive line 129, as best seen in FIG. 3. The conductive line 129 may serve as an electrical line between the first to third regions R1 to R3 on the redistribution layer 120. For example, the conductive line 129 may allow a circuit function provided from the first and second regions R1 and R2 to extend outward (e.g., to the third region R3). The conductive line 129 may be optional, and may be provided as needed.

In some embodiments, the redistribution layer 120 may further include third redistribution patterns 126 on the third region R3. When viewed in a plan view (e.g., FIG. 3), the third redistribution pattern 126 may be placed on one side of the semiconductor chip 200. The third redistribution patterns 126 may be covered with the passivation layer 128. The third redistribution pattern 126 may have a width w3 ranging from about 10 μm to about 50 μm. Each third redistribution pattern 126 may be spaced apart from each other at an interval g3, which may be about 0.5 to 3 times the width w3 of the third redistribution pattern 126. The third redistribution patterns 126 may be electrically insulated from the external pads 112 and the external connection terminals 114. For example, the third redistribution patterns 126 may be dummy patterns that are electrically insulated and independent from an electrical circuit at the same or adjacent levels. Although FIG. 2 shows only one third redistribution pattern 126, FIG. 2 is an enlarged view showing a portion of the semiconductor package and a plurality of third redistribution patterns 126 may be provided in the semiconductor package.

The semiconductor chip 200 may be mounted on the substrate 100. The semiconductor chip 200 may be provided on the first and second regions R1 and R2, and may be provided on the entirety of the first and second regions R1 and R2. The semiconductor chip 200 may include chip pads 210 on its bottom surface. The chip pads 210 may be spaced apart from each other. When viewed in a plan view, one or more of the chip pads 210 may be aligned with one or more of the first redistribution patterns 122. When viewed in a plan view, others of the chip pads 210 may be aligned or misaligned with one or more of the second redistribution patterns 124.

Connection terminals 300 may be provided between the substrate 100 and the semiconductor chip 200. For example, the connection terminals 300 may include first connection terminals 310 correspondingly disposed between the chip pads 210 and the first redistribution patterns 122 and second connection terminals 320 correspondingly disposed between the chip pads 210 and the second redistribution patterns 124.

The first connection terminals 310 may be provided on the first region R1. Each of the first connection terminals 310 may be coupled to one of the chip pads 210. Each of the first connection terminals 310 may extend into the passivation layer 128 to come into connection with one of the first redistribution patterns 122. For example, the first connection terminals 310 may be provided on first under-bumps 312 in the holes (not designated by reference numerals) of the passivation layer 128, and may be coupled through the first under-bumps 312 to the first redistribution patterns 122. First under-bumps 312 may be optional, and may be provided as needed. The semiconductor chip 200 may be electrically connected through the first connection terminals 310 to the substrate 100.

The second connection terminals 320 may be provided on the second region R2. Each of the second connection terminals 320 may be coupled to one of the chip pads 210. The second connection terminals 320 may be correspondingly provided on the second redistribution patterns 124, and the passivation layer 128 may prevent the second connection terminals 320 from being coupled to the second redistribution patterns 124. For example, the second redistribution patterns 320 may be dummy terminals Herein, the term "dummy terminal" may refer to a terminal that is electrically insulated and independent from an electrical circuit such as the redistribution patterns 122, 124, and 126 of the substrate 100. For example, the second connection terminals 320 may be provided on second under-bumps 322 on the passivation layer 128. The passivation layer 128 may separate the second under-bumps 322 from the second redistribution patterns 124. In such a configuration, the second connection terminals 320 may be spaced apart and electrically insulated from the second redistribution patterns 124 across the passivation layer 128. Second under-bumps 322 may be optional, and may be provided as needed. The second connection terminals 320 may be provided on the second region R2 where no first connection terminals 310 are provided, supporting the semiconductor chip 200. Alternatively, no second connection terminals 320 may be provided between the chip pads 210 and the second redistribution patterns 124.

A first mold layer 410 may be provided between the substrate 100 and the semiconductor chip 200. The first mold layer 410 may fill a space between the substrate 100 and the semiconductor chip 200. The first mold layer 410 may partially protrude onto a lateral surface of the semiconductor chip 200. The first mold layer 410 may surround the first and second connection terminals 310 and 320. The first mold layer 410 may be in contact with the top surface 128a of the passivation layer 128 and the bottom surface of the semiconductor chip 200. The first mold layer 410 may have a bottom surface 410a in contact with the passivation layer 128. Since the top surface 128a of the passivation layer 128 has a substantially flat shape, the bottom surface 410a of the first mold layer 410 may be a planation surface substantially parallel to a top surface of the substrate 100 (e.g., to the top surface 128a of the passivation layer 128). When no second connection terminals 320 are provided on the second redistribution patterns 124, the first mold layer 410 may lie between and electrically insulate the second redistribution patterns 124 and the chip pads 210. The first mold layer 410 may include an insulating polymeric material such as an epoxy molding compound (EMC).

A second mold layer 420 may be provided on the substrate 100. The second mold layer 420 may encapsulate the semiconductor chip 200. For example, the second mold layer 420 may be provided to cover the semiconductor chip 200 and the third region R3 of the substrate 100. The second mold layer 420 may include an insulating polymeric material such as an epoxy molding compound (EMC). The second mold layer 420 may include a material that is the same as or different from that of the first mold layer 410.

Figure 4:
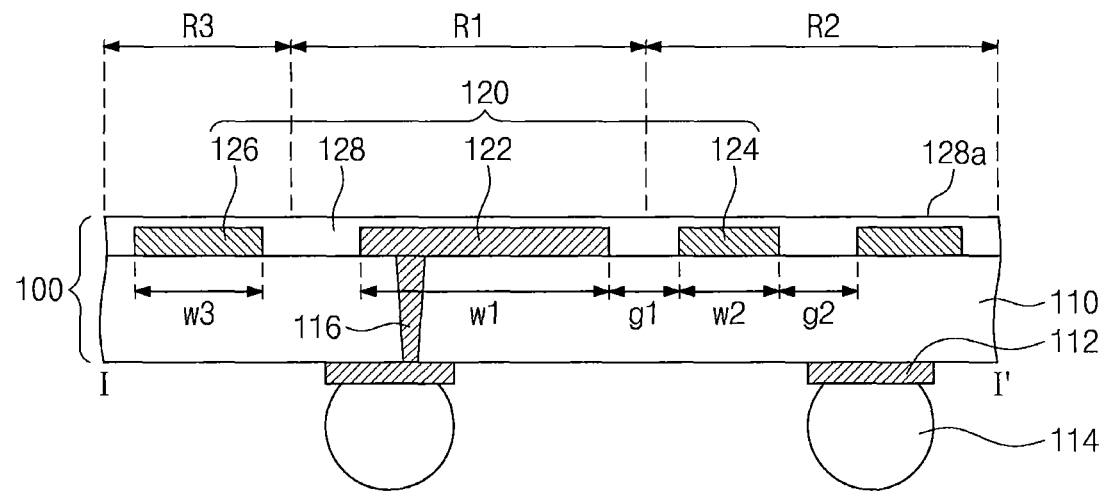
FIGS. 4 to 6 are cross-sectional views showing operations of a method of fabricating a semiconductor package according to some embodiments of the present inventive concepts.
Figure 5:
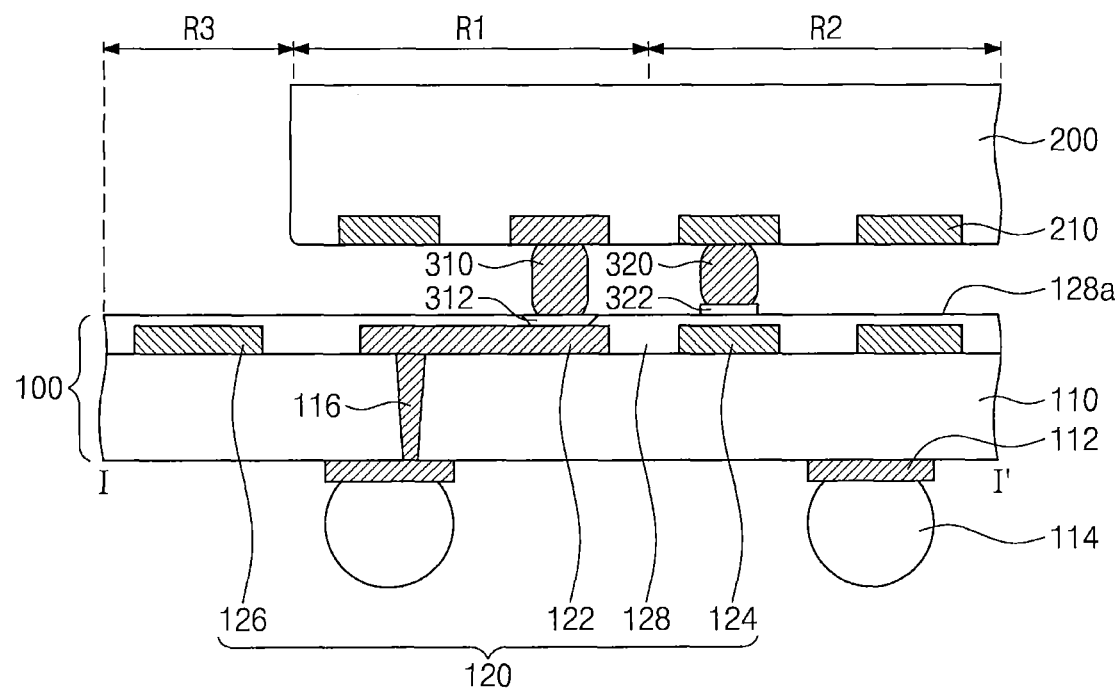
Figure 6:
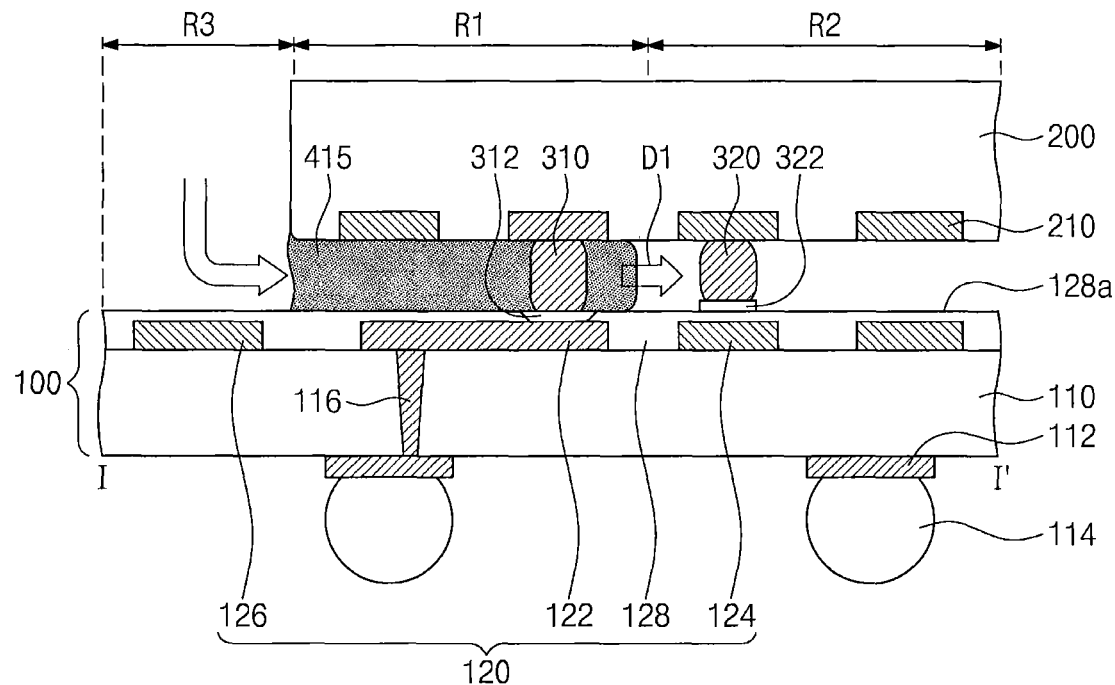

FIGS. 4 to 6 are cross-sectional views taken along line I-I' of FIG. 3, showing operations of a method of fabricating a semiconductor device according to exemplary embodiments of the present inventive concepts. Similar to FIG. 2, FIGS. 4 to 6 are partially enlarged views of a semiconductor package and each of first to third redistribution patterns may be provided in plural in the semiconductor package.

Referring to FIGS. 3 and 4, a base layer 110 may be provided. The base layer 110 may include an insulating substrate or a semiconductor substrate. External pads 112 may be formed on a bottom surface of the base layer 110, and may be electrically connected to internal lines 116 of the base layer 110. External connection terminals 114 may also be formed on the bottom surface of the base layer 110.

A redistribution layer 120 may be formed on the base layer 110, and thus a substrate 100 may be fabricated. For example, a metal layer may be formed on a top surface of the base layer 110, and may then be patterned to form first to third redistribution patterns 122, 124, and 126. The first redistribution patterns 122 may be formed on a first region R1 of the substrate 100, the second redistribution patterns 124 may be formed on a second region R2 of the substrate 100, and the third redistribution patterns 126 may be formed on a third region R3 of the substrate 100. The first redistribution patterns 122 may be electrically connected to the external pads 112 through the internal lines 116 of the base layer 110. The second and third redistribution patterns 124 and 126 may have respective widths w2 and w3 each of which has a range from about 10 μm to about 50 μm. One of the first redistribution patterns 122 and one of the second redistribution patterns 124 that neighbors the first redistribution pattern 122 may be spaced apart from each other at an interval g1, which may be about 0.5 to 3 times the width w2 of the second redistribution pattern 124. The second redistribution patterns 124 may be spaced apart from each other at an interval g2, which may be about 0.5 to 3 times the width w2 of the second redistribution pattern 124. The third redistribution patterns 126 may be spaced apart from each other at an interval g3, which may be about 0.5 to 3 times the width w3 of the third redistribution pattern 126.

A passivation layer 128 may be formed on the first to third redistribution patterns 122, 124, and 126. For example, the passivation layer 128 may be formed by coating an insulating resin on the first to third redistribution patterns 122, 124, and 126. For example, various coating processes may be employed to coat the insulating resin on the base layer 110. The insulating resin coated on the base layer 110 may cover the first to third redistribution patterns 122, 124, and 126. The passivation layer 128 may be formed to have a substantially flat top surface 128a. For example, the first to third redistribution patterns 122, 124, and 126 may be provided therebetween with narrow spaces, and the insulating may have a large (or larger) surface tension between the narrow spaces. When the insulating resin is coated, at spaces between the first to third redistribution patterns 122, 124, and 126, the surface tension may cause a top surface of the insulating resin to rise above top surfaces of the first to third redistribution patterns 122, 124, and 126. The top surface of the insulating resin may become substantially flat, and thus the passivation layer 128 may be formed to have a planation shape.

When the intervals g1, g2, and g3 between corresponding ones of the first to third redistribution patterns 122, 124, and 126 are greater than 3 times both the width w2 of the second redistribution pattern 124 and the width w3 of the third redistribution pattern 126, the insulating resin may have a small (or smaller) surface tension between the first to third redistribution patterns 122, 124, and 126. Therefore, at spaces between the first to third redistribution patterns 122, 124, and 126, the top surface of the insulating resin may descend below the top surfaces of the first to third redistribution patterns 122, 124, and 126, with the result that the passivation layer 128 may be formed to have an uneven top surface.

When the intervals g1, g2, and g3 between corresponding ones of the first to third redistribution patterns 122, 124, and 126 are less than 0.5 times both the width w2 of the second redistribution pattern 124 and the width w3 of the third redistribution pattern 126, an electrical short may occur between the first to third redistribution patterns 122, 124, and 126.

Referring to FIG. 5, a semiconductor chip 200 may be mounted on the substrate 100. For example, first under-bumps 312 and second under-bumps 322 may be formed on the passivation layer 128. The first under-bumps 312 may extend into the passivation layer 128 to come into contact with the first redistribution patterns 122. The second redistribution patterns 124 may be provided thereon with the second under-bumps 322 formed on the top surface 128a of the passivation layer 128. After that, the semiconductor chip 200 may be provided on the substrate 100. When the semiconductor chip 200 is provided on the substrate 100, first connection terminals 310 may be placed on positions corresponding to the first redistribution patterns 122 and second connection terminals 320 may be placed on positions corresponding to the second redistribution patterns 124. In some embodiments, the second connection terminals 320 may not be provided on ones of the second redistribution patterns 124. A soldering process may be performed to connect the first and second connection terminals 310 and 320 to chip pads 210 of the semiconductor chip 200. The first connection terminals 310 may be connected to the first under-bumps 312, and the second connection terminals 320 may be connected to the second under-bumps 322.

Referring to FIGS. 3 and 6, a first mold layer 410 may be formed between the redistribution layer 120 and the semiconductor chip 200. For example, a molding member 415 may fill between the redistribution layer 120 and the semiconductor chip 200. As indicated by an arrow in FIG. 6, the molding member 415 may be introduced, for example, from outside into a gap between the redistribution layer 120 and the semiconductor chip 200. A flow direction D1 of the molding member 415 may be parallel to a top surface of the substrate 100 (e.g., parallel to the top surface 128a of the passivation layer 128). Since the top surface 128a of the passivation layer 128 is or may be substantially flat, the molding member 415 may have less resistance to the flow thereof. The molding member 415 may then be introduced to fill or flow into the gap between the redistribution layer 120 and the semiconductor chip 200, and the occurrence of voids, such as air gaps, may be reduced or prevented between the redistribution layer 120 and the semiconductor chip 200.

Referring again to FIGS. 2 and 3, the molding member 415 may be cured to form the first mold layer 410. A second mold layer 420 may be formed on the substrate 100. The second mold layer 420 may cover the semiconductor chip 200 and the third region R3 of the substrate 100.

In contrast, when the second redistribution patterns 124 are not provided, voids may occur between the redistribution layer 120 and the semiconductor chip 200.

Figure 7:
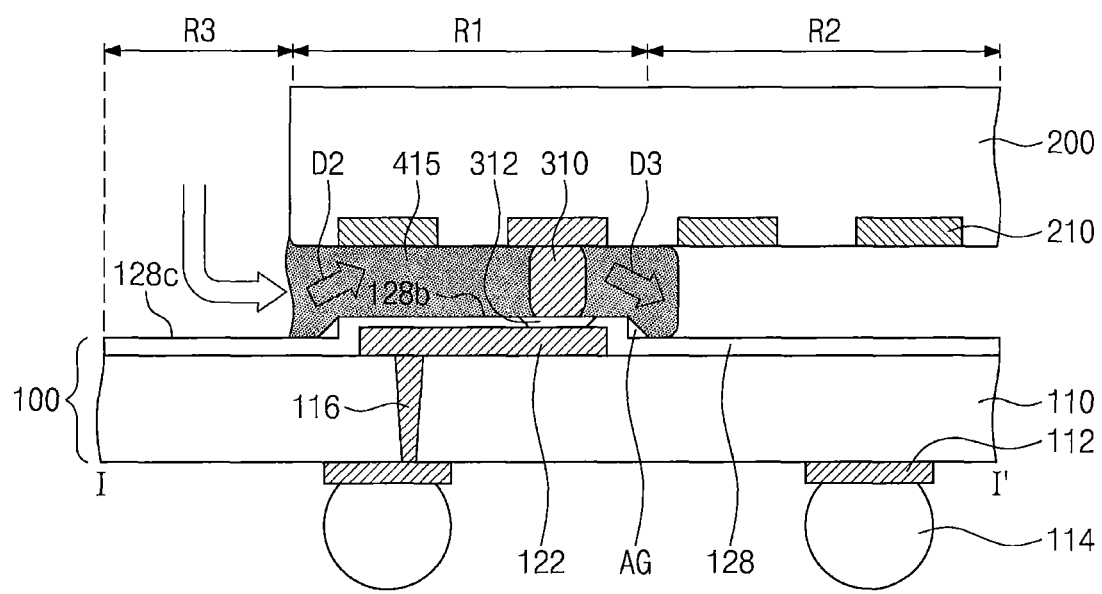
FIGS. 7 and 8 are cross-sectional views showing operations of a method of fabricating a semiconductor package in which second redistribution patterns are absent.
Figure 8:
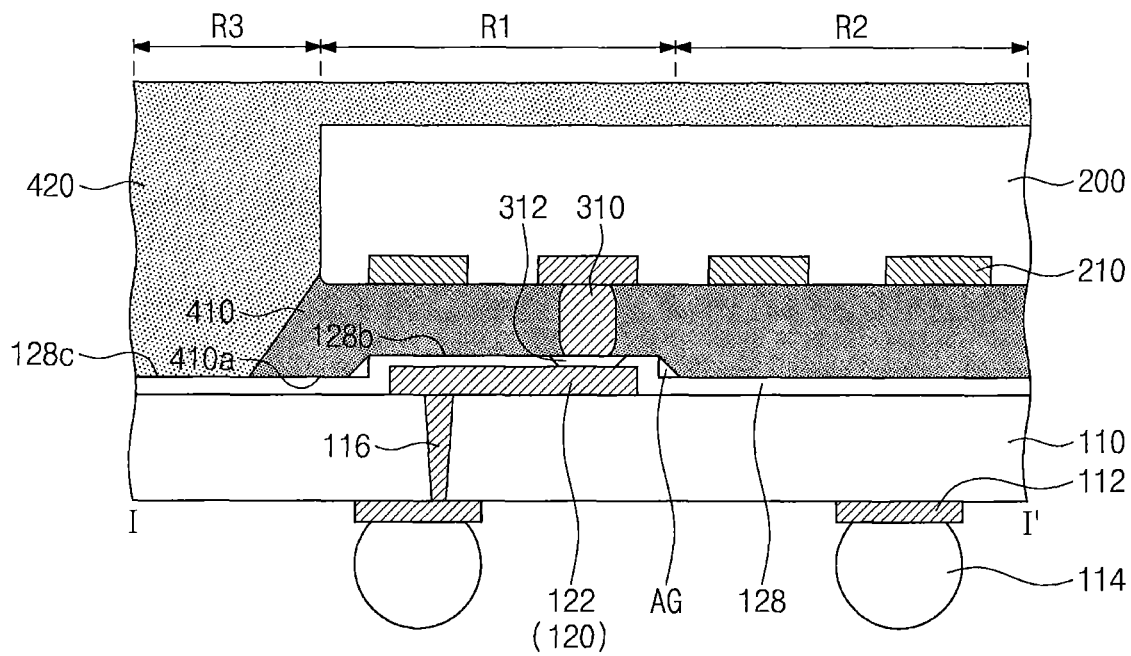

FIGS. 7 and 8 are cross-sectional views showing operations of a method of fabricating a semiconductor package in which second redistribution patterns are absent.

Referring to FIG. 7, the redistribution layer 120 may be formed on the base layer 110, and thus the substrate 100 may be fabricated. For example, a metal layer may be formed on the top surface of the base layer 110, and may then be patterned to form the first redistribution patterns 122. The first redistribution patterns 122 may be formed on the first region R1 of the substrate 100. The first redistribution patterns 122 may be electrically connected to the external pads 112 through the internal lines 116 of the base layer 110.

The passivation layer 128 may be formed on the first redistribution patterns 122. For example, the passivation layer 128 may be formed by coating an insulating resin on the top surface of the base layer 110 and the top surfaces of the first redistribution patterns 122. The coated insulating resin may overlay or cover the first redistribution patterns 122. The top surfaces of the first redistribution patterns 122 may be located at a higher level than that of the top surface of the base layer 110, and a step difference may be formed between the base layer 110 and the first redistribution patterns 122. The insulating resin may be conformally formed along the top surface of the base layer 110 and the top surfaces of the first redistribution patterns 122, and a top surface 128b of the passivation layer 128 on the first redistribution patterns 122 may be located at a higher level than that of a top surface 128c of the passivation layer 128 on the base layer 110.

The semiconductor chip 200 may be mounted on the substrate 100. For example, the first under-bumps 312 may be formed on the passivation layer 128. The first under-bumps 312 may extend into the passivation layer 128 to come into contact with the first redistribution patterns 122. Thereafter, the semiconductor chip 200 may be provided on the substrate 100. When the semiconductor chip 200 is provided on the substrate 100, the first connection terminals 310 may be placed on positions corresponding to the first redistribution patterns 122. A soldering process may be performed to connect the first connection terminals 310 to the chip pads 210 of the semiconductor chip 200. The first connection terminals 310 may be connected to the first under-bumps 312.

The molding member 415 may be injected between the redistribution layer 120 and the semiconductor chip 200. As indicated by an arrow in FIG. 7, the molding member 415 may be introduced from outside into a gap between the redistribution layer 120 and the semiconductor chip 200. When the molding member 415 is introduced, the flow of the molding member 415 may be resisted, and may be heavily resisted, by the step difference between the top surfaces 128b and 128c of the passivation layer 128. For example, the molding member 415 may meet or have resistance or may have resisted flow caused by the step difference of the passivation layer 128, and may flow either in an ascending direction D2 from the substrate 100 or in a descending direction D3 toward the substrate 100. In addition, air exhaust may be difficult in the vicinity of the step difference of the passivation layer 128, and an air gap AG may form. When the air gap AG is formed in the molding member 415, the first mold layer 410 of FIG. 8 may have a reduced strength, and air of the air gap AG may corrode the first mold layer 410 and/or the first redistribution patterns 122.

Referring to FIG. 8, the molding member 415 may be cured to form the first mold layer 410. The second mold layer 420 may be formed on the substrate 100. The second mold layer 420 may cover the semiconductor chip 200 and the third region R3 of the substrate 100.

Semiconductor packages according to some embodiments of the inventive concepts may be configured so that the substrate 100 may be provided with the first redistribution patterns 122 on a first region or regions, and may also be provided on a second region or other region(s) with the second and third redistribution patterns 124 and 126 that serve as dummy patterns for structural stability. The second and third redistribution patterns 124 and 126, which may be formed of a metallic material, may protect the substrate 100 and the semiconductor chip 200 from external impacts. In addition, the second redistribution patterns 124 may be provided with the second connection terminals 320 serving as dummy terminals for supporting the semiconductor chip 200, and thus the semiconductor package may increase in structural stability.

In fabricating the semiconductor package, the second and third redistribution patterns 124 and 126 may force the passivation layer 128 to have a planation shape, and the molding member 415 may be introduced more easily when the first mold layer 410 is formed in a subsequent process. The first mold layer 410 may accordingly fill or flow between the redistribution layer 120 and the semiconductor chip 200, and the occurrence of voids may be reduced or prevented.

Figure 9:
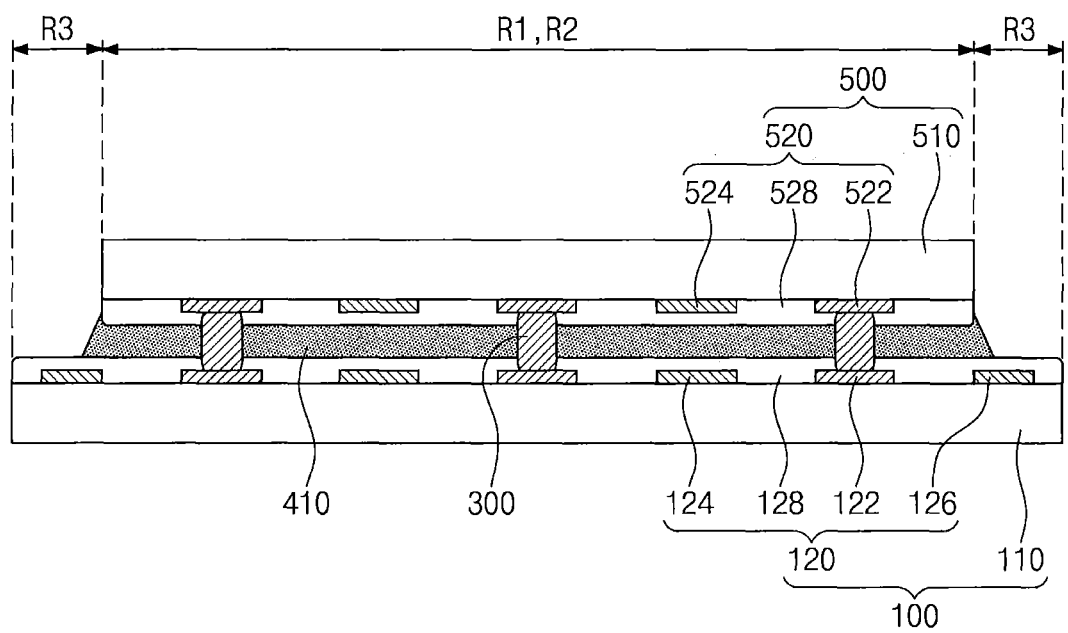
FIG. 9 is a cross-sectional view showing operations of a method of fabricating a semiconductor package according to some embodiments of the present inventive concepts.
Figure 10:
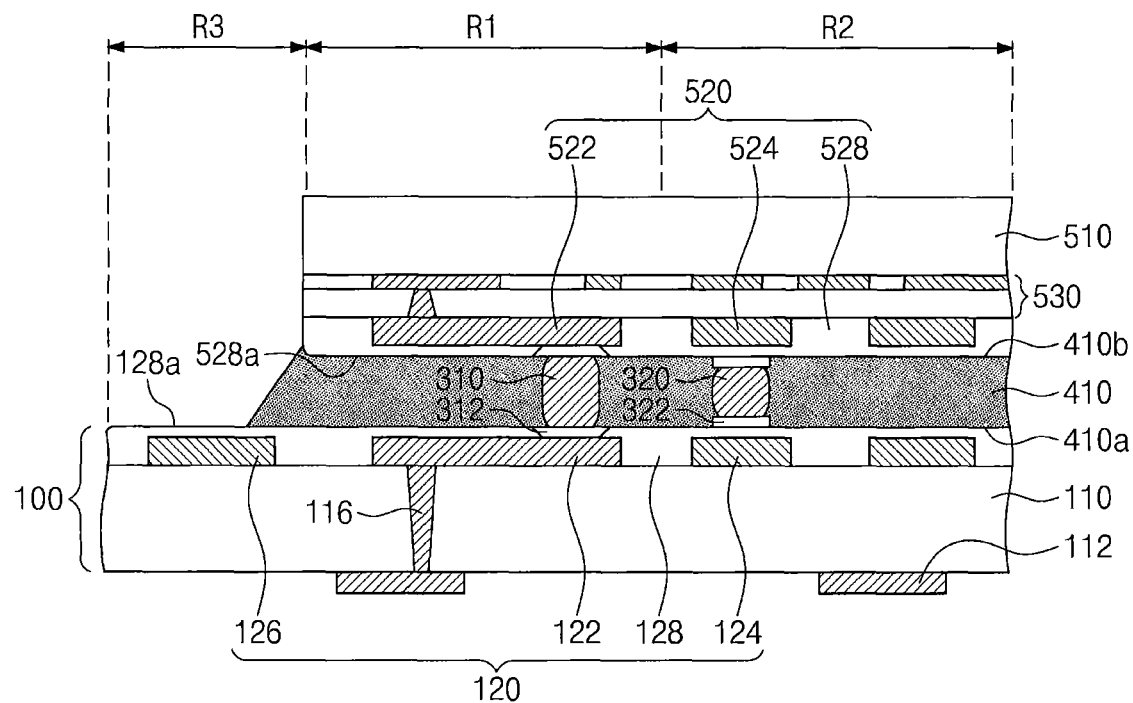
FIG. 10 is an enlarged view showing a portion of FIG. 9.

FIG. 9 is a simplified cross-sectional view showing a semiconductor package according to some embodiments of the present inventive concepts, some components of which semiconductor package are omitted for convenience of explanation. FIG. 10 is an enlarged view showing a portion of FIG. 9. In the following description, components substantially the same as those discussed with reference to FIGS. 1 to 3 are allocated the same reference numerals thereto, and a repetitive description thereof will be omitted.

Referring to FIGS. 9 and 10, a first substrate 100 may have a first region R1, a second region R2, and a third region R3 that are non-overlapping with one another, when viewed in a plan view. The first substrate 100 may include a first base layer 110 and a first redistribution layer 120.

The first base layer 110 may include an insulating substrate or a semiconductor substrate. The first base layer 110 may have external pads 112 on its bottom surface. The external pads 112 may be provided thereon with external connection terminals 114 such as solder bumps (which are omitted from FIGS. 9 and 10).

The first redistribution layer 120 may be disposed on the first base layer 110. The first redistribution layer 120 may include first redistribution patterns 122, second redistribution patterns 124, third redistribution patterns 126, and a first passivation layer 128 that are provided on a top surface of the first base layer 110.

The first redistribution patterns 122 may be on or in the first region R1. The second redistribution patterns 124 may be on or in the second region R2. The third redistribution patterns 126 may be on or in the third region R3. The first redistribution patterns 122 may be electrically connected to the external pads 112 through internal lines 116 of the first base layer 110. The second and third redistribution patterns 124 and 126 may be electrically insulated from the external pads 112 and from the external connection terminals 114. For example, the second and third redistribution patterns 124 and 126 may be dummy patterns that are electrically insulated and independent from an electrical circuit at a level the same or adjacent levels. The first to third redistribution patterns 122, 124, and 126 may include a metallic material.

The first passivation layer 128 may cover the top surface of the first base layer 110 and the first redistribution patterns 122, the second redistribution patterns 124, and the third redistribution patterns 126. The first passivation layer 128 may have a top surface 128a that is a substantially flat planation surface. The top surface 128a of the first passivation layer 128 may be parallel to the top surface of the first base layer 110. The first passivation layer 128 may include holes (not designated by reference numerals) that expose the first redistribution patterns 122. The first passivation layer 128 may include an ABF (Ajinomoto Build-up Film) or an insulating polymer such as an epoxy-based polymer.

A second substrate 500 may be provided on the first substrate 100. The second substrate 500 may include a second base layer 510, a second redistribution layer 520, and a third redistribution layer 530.

The second base layer 510 may include an insulating substrate or a semiconductor substrate.

The second redistribution layer 520 may be disposed on a bottom surface of the second base layer 510. The second redistribution layer 520 may include fourth redistribution patterns 522, fifth redistribution patterns 524, and a second passivation layer 528 that are provided on the bottom surface of the second base layer 510.

The fourth redistribution patterns 522 may be disposed on the first region R1. The fifth redistribution patterns 524 may be disposed on the second region R2. The fifth redistribution patterns 524 may be dummy patterns that are electrically and independently of an electrical circuit at the same or adjacent levels. The fourth and fifth redistribution patterns 522 and 524 may include a metallic material.

The second passivation layer 528 may cover the bottom surface of the second base layer 510, the fourth redistribution patterns 522, and the fifth redistribution patterns 524. The second passivation layer 528 may have a bottom surface 528a that is a substantially flat planation surface. The bottom surface 528a of the second passivation layer 528 may be parallel to the bottom surface of the second base layer 510. The second passivation layer 528 may include holes (not designated by reference numerals) that expose the fourth redistribution patterns 522. The second passivation layer 528 may include an ABF (Ajinomoto Build-up Film) or an insulating polymer such as an epoxy-based polymer.

The third redistribution layer 530 may be provided between the second redistribution layer 520 and the second base layer 510. The third redistribution layer 530 may include conductive patterns (not designated by reference numerals) electrically connected to the fourth redistribution patterns 522 and insulating patterns (not designated by reference numerals) between the conductive patterns. The third redistribution layer 530 may be optional, and may be provided as needed.

Connection terminals 300 may be provided between the first substrate 100 and the second substrate 500. For example, the connection terminals 300 may include first connection terminals 310 correspondingly disposed between the first redistribution patterns 122 and the fourth redistribution patterns 522 and second connection terminals 320 correspondingly disposed between the second redistribution patterns 124 and the fifth redistribution patterns 524.

The first connection terminals 310 may be on the first region R1. Each of the first connection terminals 310 may extend into the first passivation layer 128 to come into connection with one of the first redistribution patterns 122, and further extend into the second passivation layer 528 to come into connection with one of the fourth redistribution patterns 522.

The second connection terminals 320 may be on the second region R2. The second connection terminals 320 may be correspondingly provided on the second redistribution patterns 124, but the first passivation layer 128 may prevent the second connection terminals 320 from being coupled to the second redistribution patterns 124. The second connection terminals 320 may be correspondingly provided on the fifth redistribution patterns 524, but the second passivation layer 528 may prevent the second connection terminals 320 from being coupled to the fifth redistribution patterns 524. The second connection terminals 320 may be spaced apart from the second and fifth redistribution patterns 124 and 524 across the first and second passivation layers 128 and 528, and may be electrically insulated from the second and fifth redistribution patterns 124 and 524. For example, the second connection terminals 320 may be dummy terminals that are electrically insulated and independent from electrical circuits such as the redistribution patterns 122, 124, 126, 522, and 524 of the first and second substrate 100 and 500. The second connection terminals 320 may be provided on the second region R2 where no first connection terminals 310 are provided, supporting the second substrate 500. Alternatively, the second connection terminals 320 may not be provided between the second redistribution patterns 124 and the fifth redistribution patterns 524.

A first mold layer 410 may be provided between the first substrate 100 and the second substrate 500. The first mold layer 410 may fill a space between the first substrate 100 and the second substrate 500. The first mold layer 410 may partially protrude onto a lateral surface of the second substrate 500. The first mold layer 410 may surround the first and second connection terminals 310 and 320. The first mold layer 410 may be in contact with the top surface 128a of the first passivation layer 128 and the bottom surface 528a of the second passivation layer 528. The first mold layer 410 may have a bottom surface 410a in contact with the first passivation layer 128 and a top surface 410b in contact with the second passivation layer 528. Since each of the top surface 128a and the bottom surface 528a respectively of the first passivation layer 128 and the second passivation layer 528 has a substantially flat shape, the bottom surface 410a and the top surface 410b of the first mold layer 410 may be planation surfaces substantially parallel respectively to a top surface of the first substrate 100 and a bottom surface of the second substrate 500. The first mold layer 410 may include an insulating polymeric material such as epoxy molding compound (EMC).

According to some embodiments of the inventive concepts, each of the top and bottom surfaces respectively of the first and second substrates 100 and 500 may be formed to have a flat shape, and the molding member 415 may be introduced more easily when the first mold layer 410 is formed in a subsequent process. The first mold layer 410 may accordingly fill or flow between the first substrate 100 and the second substrate 500, and the occurrence of voids may be reduced or prevented.

Figure 11:
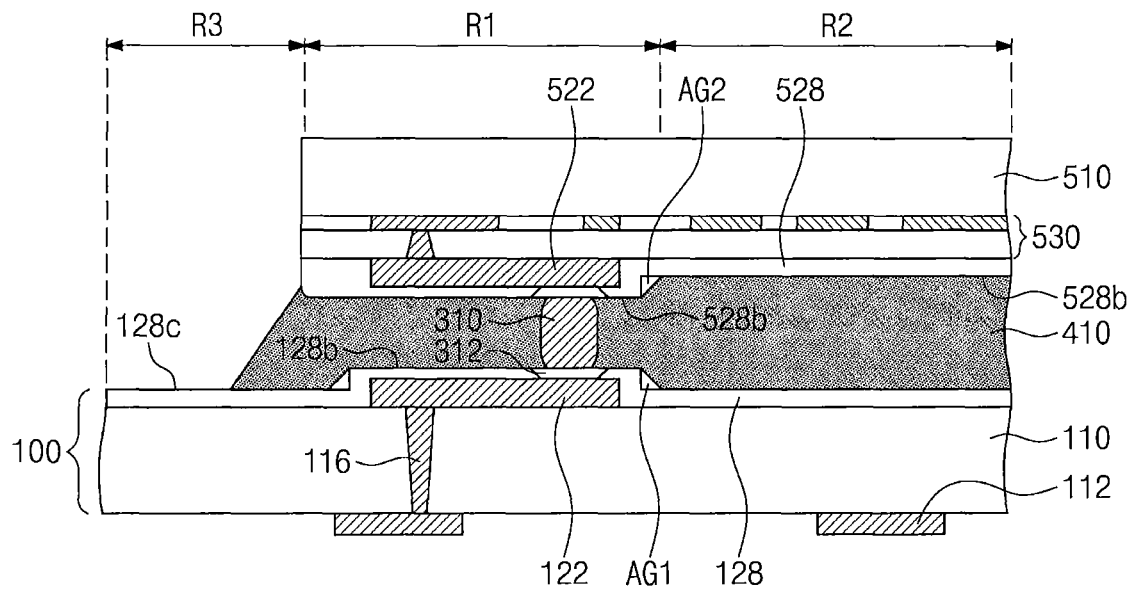
FIG. 11 is a cross-sectional view showing a semiconductor package in which second, third, and fifth redistribution patterns are absent.

FIG. 11 is a cross-sectional view showing a semiconductor package without second, third, and fifth redistribution patterns.

Referring to FIG. 11, the first substrate 100 may include neither the second nor third redistribution patterns (e.g., the second redistribution pattern 124 and the third redistribution pattern 126 of FIG. 10). As discussed with reference to FIG. 7, the first passivation layer 128 may be formed to have stepped top surfaces 128b and 128c. The top surface 128b of the first passivation layer 128 on the first redistribution patterns 122 may be located at a higher level than that of the top surface 128c of the first passivation layer 128 on the first base layer 110.

The second substrate 500 may not include the fifth redistribution pattern (e.g., the fifth redistribution pattern 524 of FIG. 10). The second passivation layer 528 may be formed to have stepped bottom surfaces 528b and 528c. The bottom surface 528b of the second passivation layer 528 on the fourth redistribution patterns 522 may be located at a lower level than that of the bottom surface 528c of the second passivation layer 528 on the second base layer 510.

The first mold layer 410 may be provided between the first substrate 100 and the second substrate 500. A first air gap AG1 may be formed between the first substrate 100 and the first mold layer 410, and a second air gap AG2 may be formed between the second substrate 500 and the first mold layer 410. For example, in fabricating a semiconductor package, the first substrate 100 and the second substrate 500 may be provided therebetween with the molding member 415 to form the first mold layer 410, and in this case, the first and second air gaps AG1 and AG2 may be formed without air exhaust in the vicinity of the step differences of the first and second passivation layers 128 and 528. When the first and second air gaps AG1 and AG2 are formed in the molding member 415, the first mold layer 410 of FIG. 11 may have a reduced strength, and air of the first air gap AG1 and/or the second air gap AG2 may corrode the first mold layer 410, the first redistribution patterns 122, and/or the fourth redistribution patterns 522.

Figure 12:
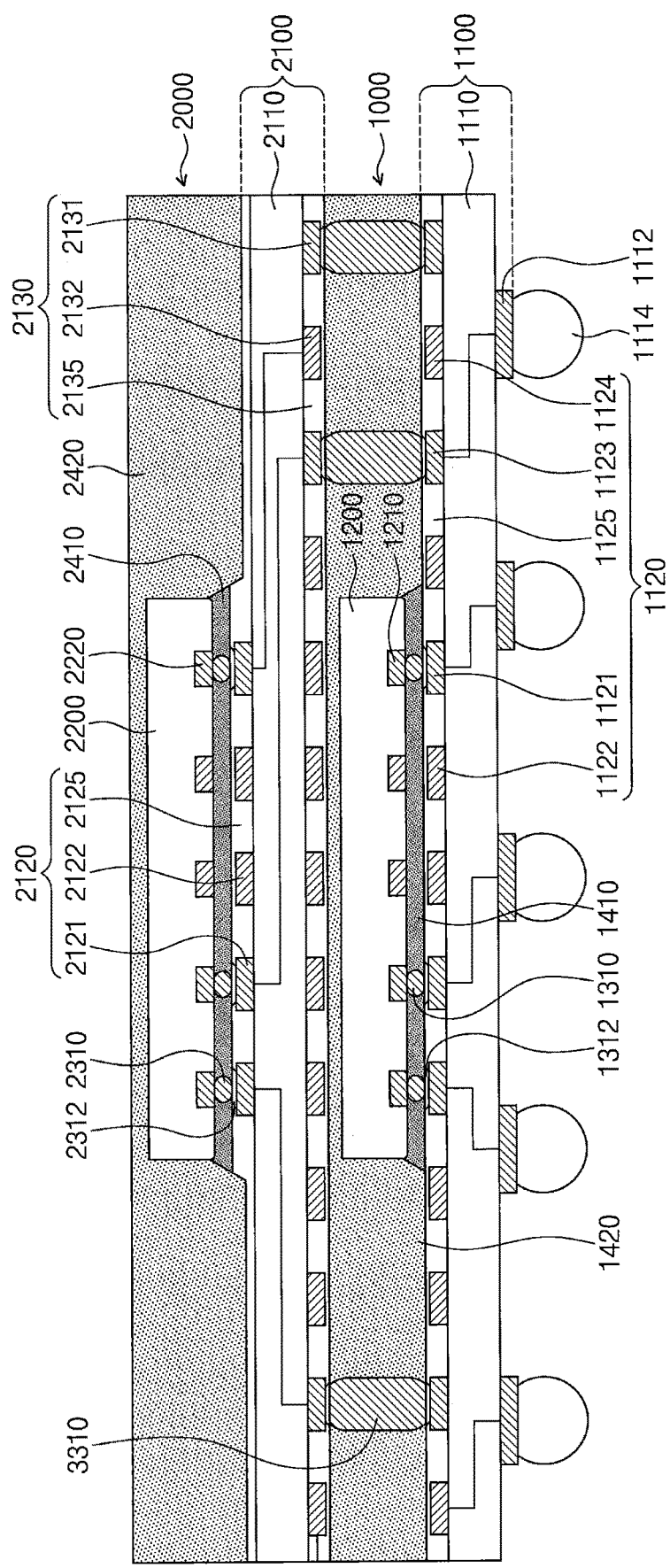
FIG. 12 illustrates a cross-sectional view showing operations of a method of fabricating a semiconductor package according to some embodiments of the present inventive concepts.

FIG. 12 is a cross-sectional view showing operations of a method of fabricating a semiconductor package according to some embodiments of the present inventive concepts. In the following description, components substantially the same as those discussed with reference to FIGS. 9 and 10 are allocated the same reference numerals thereto, and a repetitive description thereof will be omitted.

Referring to FIG. 12, a lower package 1000 may be provided. The lower package 1000 may include a lower semiconductor chip 1200 mounted on a lower substrate 1100.

The lower substrate 1100 may include a lower base layer 1110 and a lower redistribution layer 1120. The lower base layer 1110 may have external pads 1112 on a bottom surface thereof. The external pads 1112 may be provided with external connection terminals 1114. The lower redistribution layer 1120 may be on the lower base layer 1110. The lower redistribution layer 1120 may include first to fourth lower redistribution patterns 1121, 1122, 1123, and 1124 and a lower passivation layer 1125 that are provided on a top surface of the lower base layer 1110. The first and third lower redistribution patterns 1121 and 1123 may be electrically connected to the external pads 1112 through internal lines (not designated by reference numerals) of the lower base layer 1110. The second and fourth lower redistribution patterns 1122 and 1124 may be electrically insulated from the external pads 1112 and the external connection terminals 1114. The lower redistribution layer 1125 may cover the top surface of the lower base layer 1110 and the first to fourth lower redistribution patterns 1121 to 1124. The lower passivation layer 1125 may have a top surface whose shape is substantially flat. The lower passivation layer 1125 may include holes (not designated by reference numerals) that expose the first and third lower redistribution patterns 1121 and 1123.

The lower semiconductor chip 1200 may be mounted on the lower substrate 1100. The lower semiconductor chip 1200 may include lower chip pads 1210 on its bottom surface. When viewed in plan, each of the lower chip pads 1210 may be aligned with a corresponding one of the first and second lower redistribution patterns 1121 and 1122.

First connection terminals 1310 may be between the lower chip pads 1210 and the first lower redistribution patterns 1121. Each of the first connection terminals 1310 may be coupled to one of the lower chip pads 1210. For example, the first connection terminals 1310 may be provided on lower under-bumps 1312 provided in the lower passivation layer 1125, and coupled through the lower under-bumps 1312 to the first lower redistribution patterns 1121. Each of the first connection terminals 1310 may extend into the lower passivation layer 1125 to come into connection with one of the first lower redistribution patterns 1121.

A first lower mold layer 1410 may be provided between the lower substrate 1100 and the lower semiconductor chip 1200. The first lower mold layer 1410 may fill a space between the lower substrate 1100 and the lower semiconductor chip 1200. The first lower mold layer 1410 may have a bottom surface in contact with the lower passivation layer 1125. The bottom surface may be a planation surface.

A second lower mold layer 1420 may be provided on the lower substrate 1100. The second lower mold layer 1420 may encapsulate the lower semiconductor chip 1200.

An upper package 2000 may be provided on the lower package 1000. The upper package 2000 may include an upper semiconductor chip 2200 mounted on an upper substrate 2100.

The upper substrate 2100 may include an upper base layer 2110, a first upper redistribution layer 2120, and a second upper redistribution layer 2130. The first upper redistribution layer 2120 may be disposed on a top surface of the upper base layer 2110. The first upper redistribution layer 2120 may include first upper redistribution patterns 2121, second upper redistribution patterns 2122, and a first upper passivation layer 2125 that are provided on the top surface of the upper base layer 2110. The first upper passivation layer 2125 may cover the top surface of the upper base layer 2110, the first upper redistribution patterns 2121, and the second upper redistribution patterns 2122. The upper passivation layer 2125 may have a top surface whose shape is substantially flat. The first upper passivation layer 2125 may include holes (not designated by reference numerals) that expose the first upper redistribution patterns 2121. The second upper redistribution layer 2130 may be on a bottom surface of the upper base layer 2110. The second upper redistribution layer 2130 may include third upper redistribution patterns 2131, fourth upper redistribution patterns 2132, and a second upper passivation layer 2135 that are provided on the bottom surface of the upper base layer 2110. The third upper redistribution patterns 2131 may be electrically connected to the first upper redistribution patterns 2121 through internal lines (not designated by reference numerals) of the upper base layer 2110. The second and fourth upper redistribution patterns 2122 and 2132 may be electrically insulated from the first and third upper redistribution patterns 2121 and 2131. The second upper passivation layer 2135 may cover the bottom surface of the upper base layer 2110, the third upper redistribution patterns 2131, and the fourth upper redistribution patterns 2132. The second upper passivation layer 2135 may have a bottom surface whose shape is substantially flat. The bottom surface of the second upper passivation layer 2135 may be in contact with the second lower mold layer 1420. The second upper passivation layer 2135 may include holes (not designated by reference numerals) that expose the third upper redistribution patterns 2131.

The upper semiconductor chip 2200 may be mounted on the upper substrate 2100. The upper semiconductor chip 2200 may include upper chip pads 2210 on its bottom surface. When viewed in plan, each of the upper chip pads 2210 may be aligned with a corresponding one of the first and second upper redistribution patterns 2121 and 2122.

Second connection terminals 2310 may be between the upper chip pads 2210 and the first upper redistribution patterns 2121. Each of the second connection terminals 2310 may be coupled to one of the upper chip pads 2210. For example, the second connection terminals 2310 may be provided on upper under-bumps 2312 provided in the upper passivation layer 2125, and coupled through the upper under-bumps 2312 to the first upper redistribution patterns 2121. Each of the second connection terminals 2310 may extend into the first upper passivation layer 2125 to come into connection with one of the first upper redistribution patterns 2121.

A first upper mold layer 2410 may be provided between the upper substrate 2100 and the upper semiconductor chip 2200. The first upper mold layer 2410 may fill a space between the upper substrate 2100 and the upper semiconductor chip 2200. The first upper mold layer 2410 may have a bottom surface in contact with the first upper passivation layer 2125, which bottom surface is a planation surface.

A second upper mold layer 2420 may be provided on the upper substrate 2100. The second upper mold layer 2420 may encapsulate the upper semiconductor chip 2200.

Third connection terminals 3310 may be between the upper substrate 2100 and the lower substrate 1100. For example, the third connection terminals 3310 may be disposed between the third lower redistribution patterns 1123 and the third upper redistribution patterns 2131. Each of the third connection terminals 3310 may extend into the lower passivation layer 1125 to come into connection with one of the third redistribution patterns 1123, and further extend into the second upper passivation layer 2135 to come into connection with one of the third upper redistribution patterns 2131.

A semiconductor package according to some embodiments of the inventive concepts may include not only first redistribution patterns for electrical connection but also second and third redistribution patterns for structural stability. The second and third redistribution patterns may protect a substrate and a semiconductor chip from external impacts. In addition, the second redistribution patterns may be provided with second connection terminals that support the semiconductor chip, and thus the semiconductor package may increase in structural stability.

When the semiconductor package is fabricated, the second and third redistribution patterns may force a passivation layer to have a planation shape, and in a subsequent process, a molding member may be introduced more easily between a redistribution layer and the semiconductor chip. A first mold layer may then fill or flow between the redistribution layer and the semiconductor chip, and the occurrence of void may be reduced or prevented.

Although the inventive concepts of the present disclosure have been described in connection with the example embodiments illustrated in the accompanying drawings, it will be understood by one of ordinary skill in the art that variations in form and detail may be made therein without departing from the scope of the present disclosure. The above disclosed embodiments should thus be considered illustrative and not restrictive.

What is claimed is:

1. A semiconductor package, comprising:
a base layer;
a redistribution layer on the base layer, wherein the redistribution layer includes a first pattern, a second pattern, and a passivation layer that covers the first and second patterns, and wherein the second pattern is disposed at a same level as the first pattern;
a semiconductor chip on the base layer;
a first connection terminal between the base layer and the semiconductor chip, wherein the first connection terminal is coupled to a first chip pad of the semiconductor chip;
a second connection terminal between the second pattern and a second chip pad of the semiconductor chip; and
a mold layer between the base layer and the semiconductor chip,
wherein the first connection terminal extends into the passivation layer and is connected to the first pattern,
wherein the second connection terminal does not extend into the passivation layer,
wherein the second pattern and the second connection terminal are electrically insulated from each other by the passivation layer, and
wherein the second pattern is electrically insulated from the semiconductor chip.

2. The semiconductor package of claim 1, wherein a top surface of the passivation layer comprises a substantially flat shape, and wherein the top surface of the passivation layer is parallel to a top surface of the base layer.

3. The semiconductor package of claim 1, wherein, when viewed in a plan view, the first and second patterns overlap the semiconductor chip.

4. The semiconductor package of claim 3, wherein the mold layer fills a space between the second pattern and a plurality of chip pads of the semiconductor chip that includes the first chip pad.

5. The semiconductor package of claim 1, wherein, when viewed in a plan view, the second pattern is laterally spaced apart from the semiconductor chip.

6. The semiconductor package of claim 1, further comprising a plurality of second patterns that includes the second pattern, wherein the plurality of second patterns is arranged in a grid shape when viewed in a plan view.

7. The semiconductor package of claim 6, wherein an interval between the first and second patterns and an interval between two second patterns of the plurality of second patterns are each 0.5 to 3 times a width of the second pattern.

8. The semiconductor package of claim 1, wherein a bottom surface of the mold layer is a planation surface that is substantially parallel to a top surface of the base layer.

9. The semiconductor package of claim 1, wherein the base layer comprises an external terminal on a bottom surface of the base layer, and
wherein the external terminal is electrically insulated from the second pattern.

10. The semiconductor package of claim 1, wherein the mold layer covers the first and second patterns and surrounds the first connection terminal.

11. The semiconductor package of claim 1, wherein a lateral surface of the mold layer protrudes from a lateral surface of the semiconductor chip.

12. A semiconductor package, comprising:
a lower substrate comprising a lower base layer, a lower redistribution pattern and a first lower dummy pattern both on the lower base layer, and a lower passivation layer covering the lower redistribution pattern and the first lower dummy pattern;
an upper substrate comprising an upper base layer, an upper redistribution pattern and an upper dummy pattern both on the upper base layer, and an upper passivation layer covering the upper redistribution pattern and the upper dummy pattern;
a first connection terminal between and electrically connecting the lower redistribution pattern and the upper redistribution pattern;
a second connection terminal between the first lower dummy pattern and the upper dummy pattern; and
a mold layer between the lower substrate and the upper substrate,
wherein the first lower dummy pattern is buried in the lower passivation layer,
wherein the upper dummy pattern is buried in the upper passivation layer, and
wherein the second connection terminal and the first lower dummy pattern are electrically insulated from each other by the lower passivation layer.

13. The semiconductor package of claim 12, wherein the second connection terminal and the upper dummy pattern are electrically insulated from each other by the upper passivation layer.

14. The semiconductor package of claim 13, further comprising a lower semiconductor chip mounted on a top surface of the lower substrate,
wherein the second connection terminal is laterally spaced apart from the lower semiconductor chip.

15. The semiconductor package of claim 12, wherein the mold layer is between and electrically insulates the first lower dummy pattern and the upper dummy pattern.

16. The semiconductor package of claim 12, wherein the first connection terminal extends into the lower passivation layer to come into connection with the lower redistribution pattern, and extends into the upper passivation layer to come into connection with the upper redistribution pattern.

17. The semiconductor package of claim 12, wherein
top surfaces of the lower passivation layer above the lower redistribution pattern and above the first lower dummy pattern are at a same first level, and
bottom surfaces of the upper passivation layer beneath the upper redistribution pattern and beneath the upper dummy pattern are at a same first level.

18. The semiconductor package of claim 12, wherein the lower substrate further comprises a plurality of second lower dummy patterns that are non-overlapping with the upper substrate when viewed in a plan view, and wherein the plurality of second lower dummy patterns are covered with the lower passivation layer,
wherein an interval between the second lower dummy patterns is 0.5 to 3 times a width of the second lower dummy pattern.

19. The semiconductor package of claim 12, further comprising an upper semiconductor chip mounted on a top surface of the upper substrate,
wherein the upper semiconductor chip is electrically insulated from the upper dummy pattern.

* * * * *